United States Patent
Liu

(10) Patent No.: US 7,471,161 B2
(45) Date of Patent: Dec. 30, 2008

(54) SIGNAL DEGRADATION MONITORING

(75) Inventor: Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 634 days.

(21) Appl. No.: 11/241,594

(22) Filed: Sep. 30, 2005

(65) Prior Publication Data

US 2007/0075792 A1    Apr. 5, 2007

(51) Int. Cl.
     *G01N 37/00*    (2006.01)
     *G06F 1/00*    (2006.01)
     *G06F 1/04*    (2006.01)
     *H03K 3/03*    (2006.01)

(52) U.S. Cl. .......................... 331/44; 713/500

(58) Field of Classification Search .................. 331/44, 331/57; 713/500, 503
See application file for complete search history.

(56) References Cited

U.S. PATENT DOCUMENTS 6,515,549 B2 *   2/2003   Nakano ....................... 331/57
2005/0134394 A1    6/2005   Liu

* cited by examiner

*Primary Examiner*—David Mis
(74) *Attorney, Agent, or Firm*—Konrad Raynes & Victor, LLP

(57) ABSTRACT

Provided are a method, system, and device to monitor degradation of a signal due to circuit aging. In one embodiment, a signal may be applied to a data path prior to aging of the circuit producing the signal to provide a reference value. The signal generating circuit may then be aged while the data path is disabled to protect the data path from the effects of circuit aging. Upon reenabling the data path, the signal may be reapplied in an after stress test to measure the effects of circuit aging on the circuitry generating the signal. For example, the effects of circuit aging may be measured for clock duty cycle degradation, clock skew degradation and signal margin degradation as well as other signal parameters. Additional embodiments are described and claimed.

22 Claims, 7 Drawing Sheets

SIGNAL DEGRADATION MONITORING

BACKGROUND

Digital circuits such as microprocessors, memory circuits, busses and other devices are frequently synchronous circuits in which operations may be synchronized by one or more clock signals. A clock signal is typically a periodic signal having a particular frequency. However, due to circuit aging effects, the clock signals may change over time. Thus, for example, the duty cycle of a clock signal at a particular frequency may change due to circuit aging effects. Also, the timing relationship between two or more clock signals may become skewed due to circuit aging. Such changes can alter or disrupt the operation of synchronous circuits.

Copending U.S. application Ser. No. 10/745,427, filed Dec. 23, 2003 (publication No. U.S. 2005/0134394) entitled "On-Chip Transistor Degradation Monitoring", by the present applicant and assigned to common assignee, Intel Corporation, is directed to, in one embodiment, an integrated on-chip characterization circuit which includes a selectively enabled ring oscillator to generate a reference oscillating signal, a free-running ring oscillator to generate a free-running oscillating signal, and a comparison circuit coupled to the selectively enabled ring oscillator and the free-running ring oscillator. From the reference oscillating signal and the free-running oscillating signal, the comparison circuit determines a measure of transistor degradation. The selectively enabled ring oscillator when disabled, avoids or retards degradation of the of the selectively enabled ring oscillator. More specifically, sources and drains of transistors of the selectively enabled ring oscillator are coupled to the same potential to avoid or retard degradation of the transistors of the selectively enabled ring oscillator.

DETAILED DESCRIPTION

In the following description, reference is made to the accompanying drawings which form a part hereof and which illustrate several embodiments. It is understood that other embodiments may be utilized and structural and operational changes may be made without departing from the scope of the descriptions provided.

Figure 1:
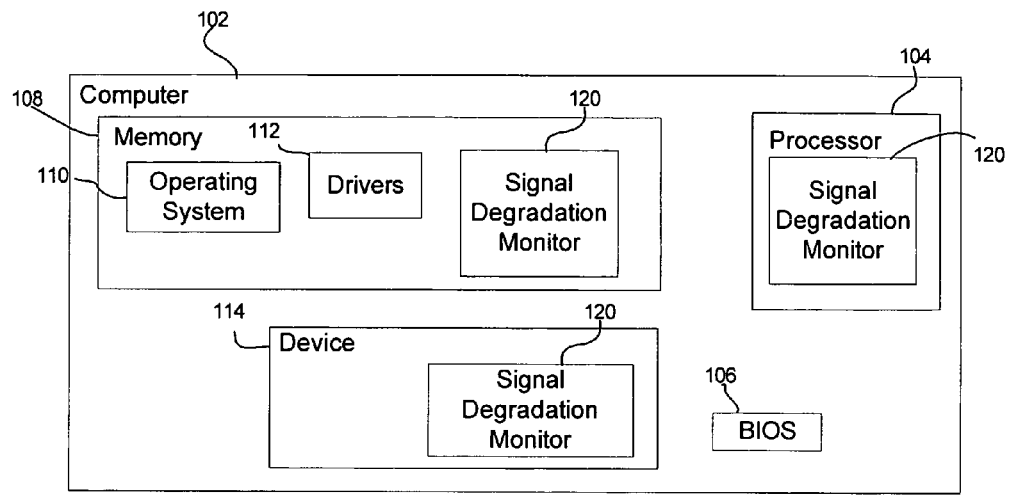
FIG. 1 is a schematic diagram illustrating one environment which may utilize a signal degradation monitoring circuit in accordance with one embodiment of the description provided herein.

FIG. 1 illustrates one example of a computing environment which may be used with the described embodiments. A computer 102 includes a processor 104 (such as one or more central processing units (CPU)), a basic input/output system (BIOS) 106 including code executed by the processor 104 to initialize and control various computer 102 components (e.g., the keyboard, display screen, disk drives, serial communications, etc.) during a boot sequence. The computer 102 includes a memory 108, comprising one or more volatile memory devices, such as volatile random access memory (RAM), in which an operating system 110 and one or more drivers 112, such as a device driver interfacing with an attached device 114, are loaded into the memory 108 implementing a runtime environment. In some applications, the memory 108 may further include nonvolatile memory (e.g., a flash memory, Electronically Erasable Programmable Memory (EEPROM), optical disk drives, magnetic disk drives etc.)

The device 114 may comprise any type of Input/Output (I/O) device internal or external to a housing of the computer 102, such as a hard disk drive, or a video chipset, which may be integrated on the computer 102 motherboard or on an expansion card inserted in an expansion slot on the computer 102 motherboard. The BIOS 106 may be implemented in firmware in a non-volatile memory device on the computer 102 motherboard, such as a Flash memory, Read Only Memory (ROM), Programmable ROM (PROM), etc. The BIOS 106 code indicates the sequence of the boot operations. The operating system 110 may comprise a suitable operating system, such as a Microsoft® Windows® operating system, Linux™, Apple® Macintosh®, etc. (Microsoft and Windows are registered trademarks of Microsoft Corporation, Apple and Macintosh are registered trademarks of Apple Computer, Inc., and Linux is a trademark of Linus Torvalds). The computer 102 may comprise any computing device known in the art, such as a mainframe, server, personal computer, workstation, laptop, handheld computer, telephony device, network appliance, virtualization device, storage controller, network controller, etc. Any suitable CPU or processor 104 and operating system may be used.

In accordance with one aspect of the description provided herein, one or more of the devices of a system such as the computer 102 may include a signal degradation monitoring circuit 120 to monitor alterations or degradations to a signal caused by circuit aging or other changes to electrical and circuit operating parameters. For example, the memory 108 may include a signal degradation monitoring circuit 120 within the memory 108 to monitor changes in a clock or other signals within the memory 108. The signal degradation monitoring circuit 120 may be implemented on a memory integrated circuit chip, for example. The processor 104 may similarly have a signal degradation monitoring circuit 120 to monitor changes in a clock or other signals within the processor 104. The signal degradation monitoring circuit 120 of the processor 104 may be implemented on a microprocessor monolithic integrated circuit chip, for example. Similarly, the device 114 may have a signal degradation monitoring circuit 120 to monitor changes in a clock or other signals within the device 114. The signal degradation monitoring circuit 120 of the device 114 may be implemented on an integrated circuit chip, for example. It is appreciated that a system may have as few as one and as many as several such signal degradation monitoring circuits.

Figure 3:
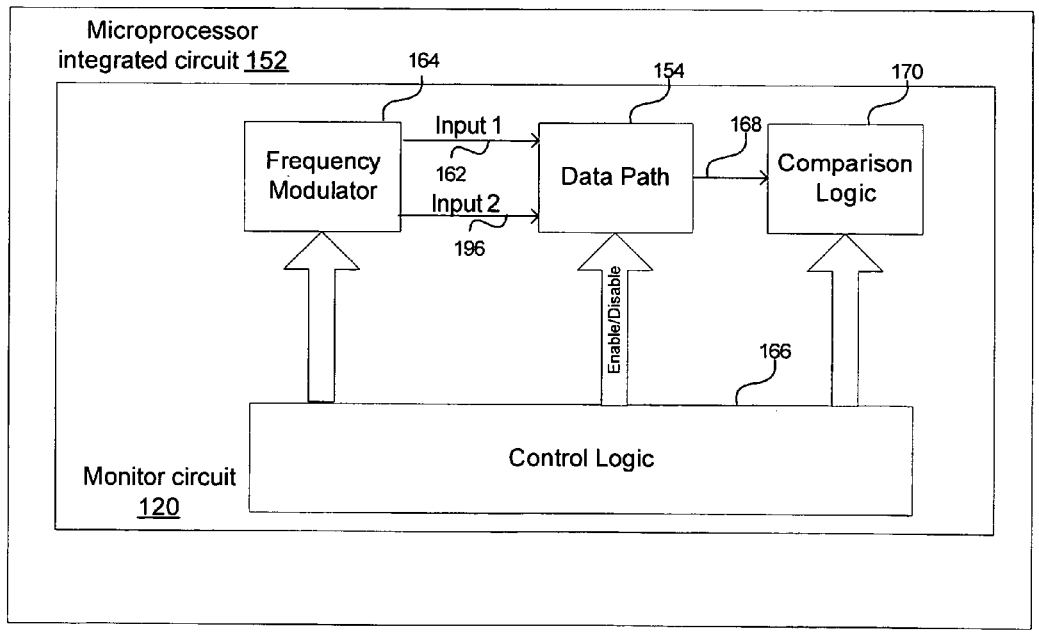
FIG. 3 is a schematic diagram of an integrated circuit having a signal degradation monitoring circuit in accordance with one embodiment of the description provided herein.
Figure 2:
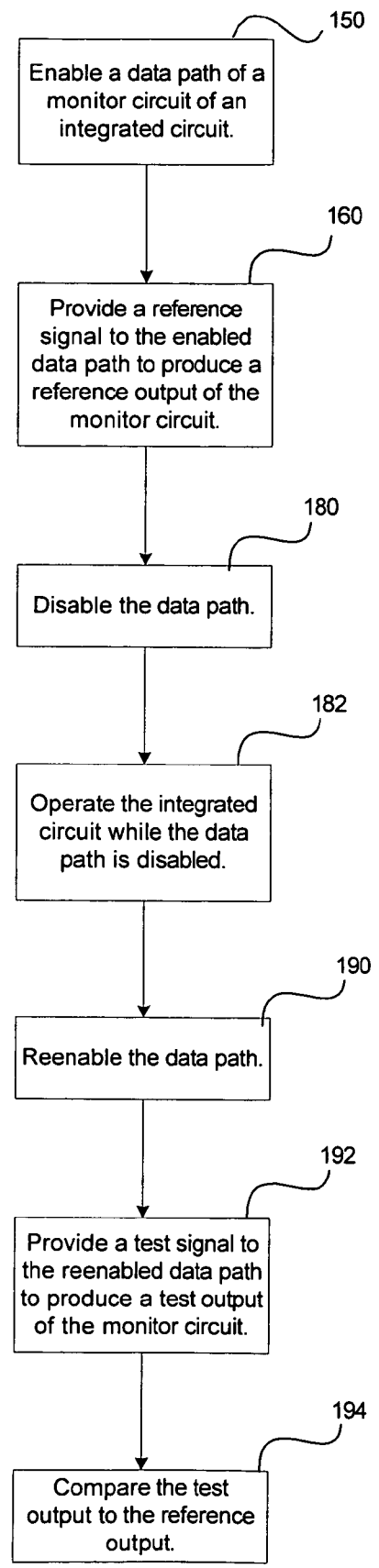
FIG. 2 illustrates one example of operations of a signal degradation monitoring circuit in accordance with one embodiment of the description provided herein.

FIG. 2 illustrates one example of operations of a monitor circuit such as the monitor circuit 120, to monitor signal degradation such as changes in a clock or other signal. In one operation, a data path of a monitor circuit of an integrated circuit is enabled (block 150). In the illustrated embodiment, the processor 104 is a microprocessor formed on a monolithic integrated circuit 152 as schematically represented in FIG. 3. The microprocessor integrated circuit 152 has an on board monitor circuit 120 which is part of the integrated circuit 152. In the illustrated embodiment, the monitor circuit 120 includes a data path 154 which when disabled, aging or degradation of the data path 154 is retarded or suspended. When enabled, the data path 154 is subject to the same or similar stresses as the rest of the integrated circuit 152 and thus ages when enabled. However, in one aspect of the present description, the enabling of the data path 154 may be limited to relatively short durations of operation such that significant aging of the data path 154 may be reduced or eliminated.

In the illustrated embodiment, the data path 154 may be configured to provide an output as a function of the duty cycle of an input clock signal. In another example, the data path 154 may be configured to provide an output as a function of the skew between a pair of input clock signals or the margin between a pair of race signals. It is appreciated that the data path 154 may be configured for other applications as well.

In another operation, a reference signal, such as a reference clock signal, for example, may be provided (block 160) to the enabled data path to produce a reference output of the monitor circuit. In the embodiment, of FIG. 3, the data path 154 of the monitor circuit 120 includes a first input 162 for a first input signal such as Input1 which may be generated by a clock circuit, for example.

In many clock circuits, the duty cycle of the generated clock is a function of, that is, affected by, the frequency of the clock signal. In accordance with another aspect of the present description, the frequency of the input signal Input1 may be swept by a frequency modulator such as a frequency modulator 164 which may be controlled by control logic 166 of the monitor circuit 120. In that the duty cycle of the input signal Input1 may vary as a function of the frequency of the input signal Input1, the output 168 of the data path 154 which can provide a measurement of clock duty cycle, can change state as a function of the frequency of the input signal Input1. Hence, the data path 154 can provide a reference output to a comparison logic 170 in response to the reference input signal Input1. The frequency of the reference input signal Input1, at which the reference output signal at output 168 changes state, may be provided by the control logic 166 to the comparison logic 170 and noted by the comparison logic 170.

In another operation, the data path, such as the data path 154, may be disabled (block 180). As previously mentioned, aging or degradation of the data path 154 may be retarded or suspended while the rest of the integrated circuit 152 is operated (block 182). As a consequence, the rest of the integrated circuit 152 is subjected to stress which can age the remaining circuits of the integrated circuit 152 while the data path 154 is protected from such stress by the disabling of the data path 154. Hence, the data path 154 should experience little or no aging while disabled.

In accordance with one aspect of the present description, the effects of such aging on a circuit such as a clock generating circuit may be measured by the monitor circuit 120. Thus, in another operation, the data path such as the data path 154 is reenabled (block 190). As previously mentioned, when enabled, the data path 154 is subject to the same or similar stresses as the rest of the integrated circuit 152 and thus ages when enabled. However, in one aspect of the present description, the reenabling of the data path 154 may be limited to relatively short durations of operation for testing such that significant aging of the data path 154 may be reduced or eliminated.

In another operation, a test signal, such as a test clock signal, for example, may be provided (block 192) to the enabled data path to produce an after stress test output of the monitor circuit. In the embodiment of FIG. 3, the test signal may be applied to the same input 162 of the data path 154 as the signal Input1. Again, the after stress test signal Input1 may be generated by same clock circuit which generated the before stress reference signal. Also, the frequency of the after stress test input signal Input1 may be swept by a frequency modulator such as a frequency modulator 164. In that the duty cycle of the after stress test input signal Input1 may vary as a function of the frequency of the test input signal Input1, the output 168 of the data path 154 which can provide a measurement of clock duty cycle, can change state as a function of the frequency of the test input signal Input1. Hence, the data path 154 can provide an after stress test output to the comparison logic 170 in response to the after stress test input signal Input1.

In another operation, a comparison may be made (block 194) between the after stress test output and the before stress reference output of the data path. In the illustrated embodiment, the frequency of the after stress test input signal Input1, at which the test output signal at output 168 changes state, may be provided by the control logic 166 to the comparison logic 170 and noted by the comparison logic 170. If the duty cycle of the after stress test input signal Input1 has changed as compared to the duty cycle of the before stress reference input signal Input1, the frequency at which the after stress test output signal at output 168 changes state will be different from the frequency at which the state of the before stress reference output signal changed. This difference in the frequencies for the after stress test and the before stress reference input signals may be noted by the comparison logic 170, thereby providing a measure of the change in duty cycle as a function of circuit aging.

As described below, the data path 154 may also be utilized to provide a measure of the aging induced skew between two clock signals Input1, Input2, provided at inputs 162, 196, respectively, of the data path 154. Similarly, the data path 154 may be utilized to provide a measure of the aging induced margin between two race signals Input1, Input2, provided at inputs 162, 196, respectively, of the data path 154. It is appreciated that changes in other types of signals may be measured as well.

Figure 4:
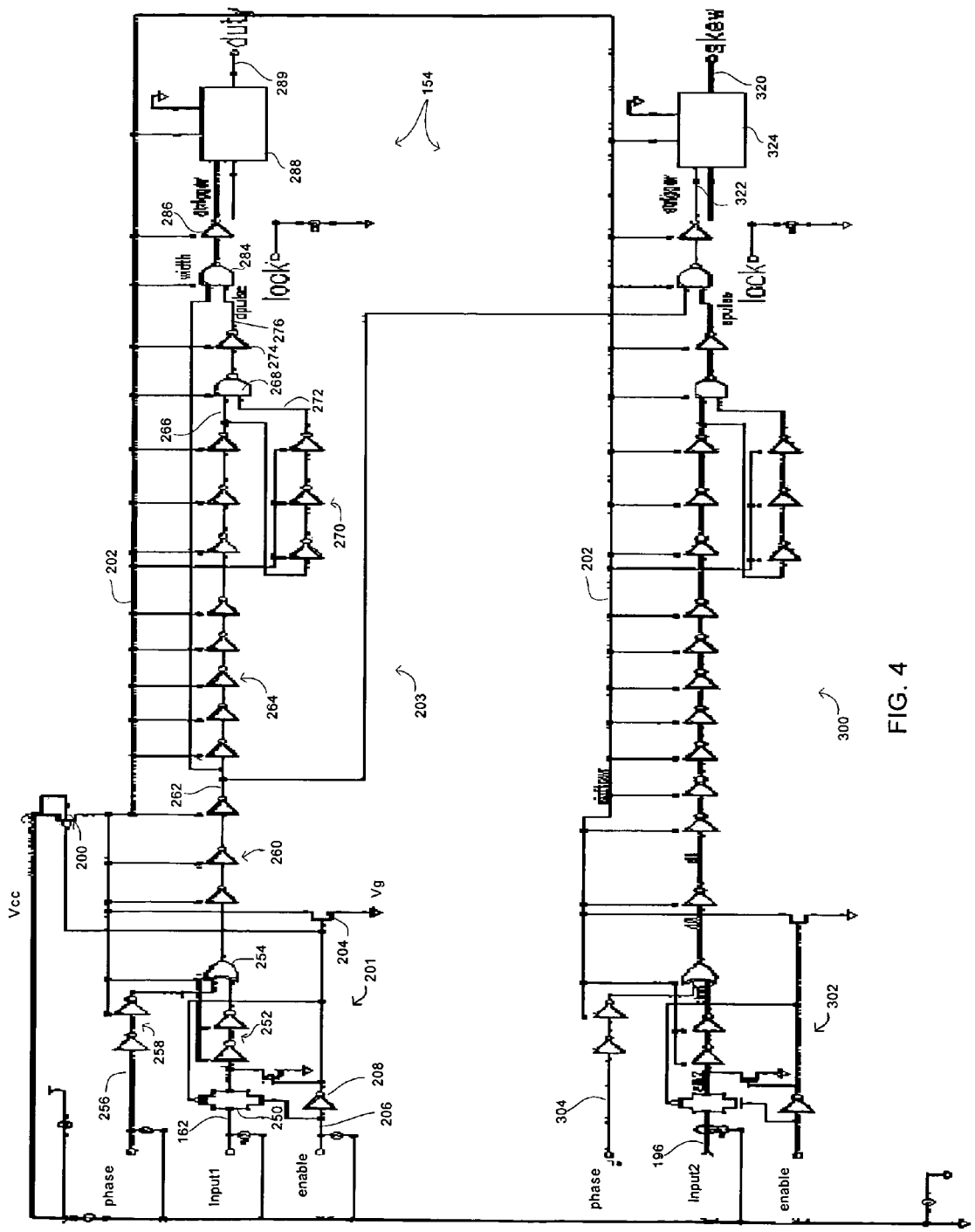
FIG. 4 is a more detailed schematic diagram of a data path portion of the signal degradation monitoring circuit of FIG. 3.

FIG. 4 shows one example of a data path 154 which may be selectively disabled to protect the data path from the effects of circuit aging. In this example, transistors may be biased to provide little or no voltage differential between the gate and the drain or source to avoid transistor aging. The data path 154 includes a voltage or power source Vcc which is coupled by a transistor switch 200 of an input section 201 of an upper circuit portion 203 to a common power bus 202 which selectively provides power to the transistors of the data path 154. The power bus 202 is also coupled by a transistor switch 204 to a ground or lower potential Vg. The conductive states of the transistor switches 200, 204 are controlled by an Enable signal provided on an input 206 which is coupled by an inverter 208 to the control inputs of the transistor switches 200, 204. The control input of the transistor switch 200 is inverted with respect to the control input of the transistor switch 204. Hence, when the Enable signal is active, the transistor switch 200 is conducting such that the common power bus 202 is at or near the potential of the power source Vcc, thereby providing power to the transistors of the data path 154 powered by the power bus 202. Conversely, when the Enable signal is inactive, the transistor switch 204 is conducting such that the common power bus 202 is at or near the Vg potential.

Figure 5:
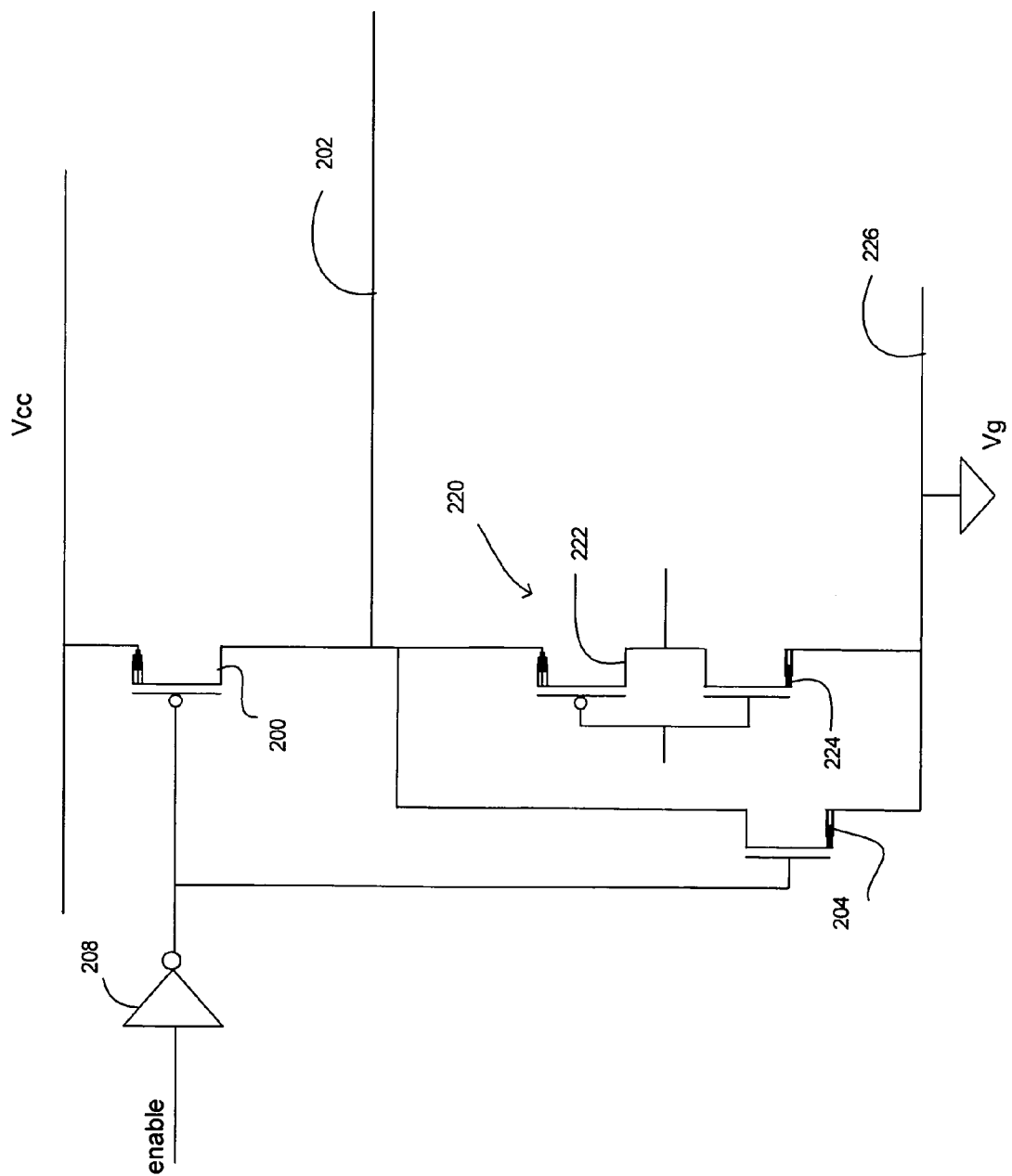
FIG. 5 is a more detailed schematic diagram of an inverter portion of the data path circuit of FIG. 4.

FIG. 5 shows a typical inverter 220 of the data path 154. The inverter 220 includes a complementary pair of transistors 222, 224 in which the source of the PMOS (p-channel metal oxide semiconductor) transistor 222 is coupled to the common power bus 202 and the source of the NMOS (n-channel metal oxide semiconductor) transistor 224 is coupled to the common ground line 226 which is at the Vg potential. As previously mentioned, when the Enable signal is active, the transistor switch 200 is conducting such that the common power bus 202 is at or near the potential of the power source Vcc. Hence, when the Enable signal is active, the potential difference Vcc−Vg is applied across the transistor pair 222, 224, thereby permitting the inverter 220 to operate. It is noted that the PMOS devices powered by node 202 may have their body connections connected to node 202 as well. Conversely, when the Enable signal is inactive, the transistor switch 204 is conducting such that the common power bus 202 is at or near the Vg potential. Hence, when the Enable signal is inactive, there is little or no potential difference applied across the transistor pair 222, 224, thereby disabling the inverter 220 and reducing or eliminating aging of the transistors 222, 224 while the enable signal is inactive. Thus, in this example, the PMOS transistors will have their n wells connected to the PMOS source instead of Vcc. The PMOS transistor 222 will be turned off and the NMOS transistor 224 will be turned on to bring the Vcc node 202 to ground or Vg. In this manner, the node 202 functions as a virtual Vcc node. The remaining transistors of the data path 154 may be selectively protected against aging in a similar manner. It is appreciated that a virtual ground approach may be utilized as well in which to disable the inverter 220, a suitable transistor such as a PMOS transistor may be turned on to pull up the virtual ground node 226 to Vcc and a suitable transistor such as an NMOS transistor may be turned off to disconnect the virtual ground node 226 from ground.

Figure 6:
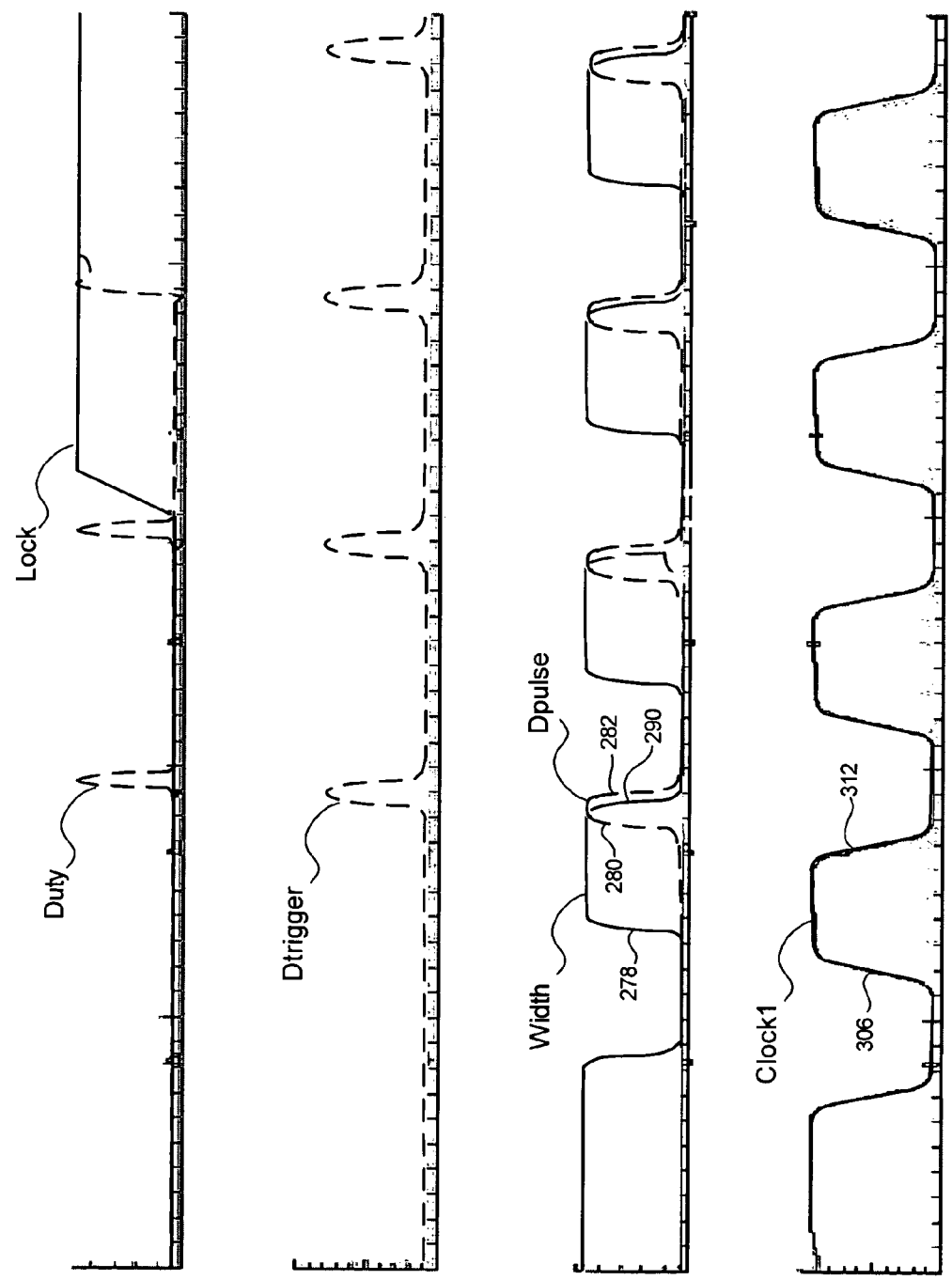
FIG. 6 is a timing diagram illustrating a duty cycle measurement operation of one embodiment of the circuit of FIG. 4.

In one embodiment, to test a signal for the effects of circuit aging, the signal may be input into the data path 154 as a before stress reference signal prior to aging the clock generating circuit. FIG. 6 shows an example of a signal, which in this example is a clock signal, and is designated Clock1. The Clock1 signal may be input at the Input1 input 162 of the data path 154 which couples the Clock1 signal via all phase switches 250 and a plurality of inverters 252 to one input of an exclusive NOR gate 254. The inverters 252 and exclusive NOR gate 254 are selectively enabled by the common power bus 202 as shown in FIG. 4.

In the illustrated embodiment, the high phase of a clock duty cycle can be tested for degradation by inputting a logical 1 in an input 256 designated Phase in FIG. 4. Conversely, the low phase of a clock duty cycle can be tested for degradation by inputting a logical 0 in the input 256 designated Phase. It is appreciated that other signals may be used in other embodiments. The Phase signal is coupled by a plurality of inverters 258 to the other input of the exclusive NOR gate 254. The output of the exclusive NOR gate 254 is coupled by a plurality of inverters 260 to an output 262 which provides a pulse signal designated Width as shown in FIG. 6. The inverters 260 are selectively enabled by the common power bus 202 as shown in FIG. 4.

The width of the signal designated Width corresponds to the width of the high phase of the duty cycle of the input signal Clock1 or the width of the low phase of the duty cycle of the input signal Clock1, in accordance with the value of the Phase input. The output 262 is coupled by a plurality of inverters 264 to an input 266 of a NAND gate 268. The output 266 is coupled by a plurality of inverters 270 to the other input 272 of the NAND gate 268. The inverters 264, 270 are selectively enabled by the common power bus 202. The output of the NAND gate 268 is coupled by an inverter 274, the output 276 of which provides a pulse signal Dpulse depicted in broken line in FIG. 6. The rising edge 278 of the Width pulse, delayed by the inverters 264, produces the rising edge 280 of the Dpulse. The Width pulse at input 266 is NANDed by the NAND gate 268 with the Width pulse delayed by the inverters 270 to provide the trailing edge 282 of the Dpulse signal.

When the Width signal and the Dpulse signal overlap as shown in FIG. 6, a NAND gate 284 coupled to an inverter 286 produces a Dtrigger signal as shown in FIG. 6. This Dtrigger signal is provided to an input of a rising edge trigger and hold latch circuit 288 which can latch the Dtrigger signal when enabled by a Lock signal provided to the latch 288 as shown in FIG. 6. Thus, when the Lock signal is active, the latch 288 will hold an active state, such as a logical 1, for example, at its output 289 designated Duty in FIG. 4. When the Lock signal is inactive, the output signal Duty is a delayed version of the signal Dpulse.

In the illustrated embodiment, the duty cycle of the input signal Clock1 being tested changes as a function of the frequency of the input signal Clock1. Thus, a change in clock frequency moves the falling edge 290 of the Width signal. An increase in frequency moves the falling edge earlier (to the left in the time line of FIG. 6). Conversely, a decrease in frequency moves the falling edge 290 later (to the right in the time line of FIG. 6). The relationship between the leading edge 278 of the Width pulse and the Dpulse signal is, in the illustrated embodiment, fixed by the delay provided by the inverters 264.

The frequency of the input signal Clock1 may be initially set at a relatively high frequency by the frequency modulator 164 (FIG. 3) such that there is no overlap between the Width pulse and the Dpulse. As the frequency modulator 164 slows the frequency of the Clock1 signal, the falling edge 290 of the Width pulse can shift later in time (to the right) until there is sufficient overlap between the Width pulse and the Dpulse to produce a Dtrigger pulse of sufficient height and width to trigger the latch 288. The fastest frequency at which the latch 288 is triggered may be noted for the signal being tested.

Hence, a clock signal such as the signal Clock1 may be input to the data path 154 a first time as a before stress reference signal and the fastest frequency at which the latch 288 is triggered may be noted for this before stress reference signal. The data path 154 may then be disabled to shield it from the effects of transistor aging while the rest of the integrated circuit 152 is operated and subjected to stress thereby aging the remainder of the integrated circuit including the clock circuitry which generates the Clock1 signal.

After aging the integrated circuit 152, the data path 154 may be reenabled and the signal Clock1 may be input to the data path 154 a second time as an after stress test signal to permit the latter Clock1 signal to be tested to determine the effects of transistor aging on the clock circuitry generating the Clock1 signal. Thus, the Clock1 signal may be provided to the now reenabled data path 154 as the frequency of the Clock1 signal is swept from high frequency to a lower frequency in the same manner as was done to generate the before stress reference data for the signal Clock1. Again, as the frequency modulator 164 slows the frequency of the Clock1 signal, the falling edge 290 of the Width pulse can shift later in time (to the right) until there is sufficient overlap between the Width pulse and the Dpulse to produce a Dtrigger pulse of sufficient height and width to trigger the latch 288. The fastest frequency at which the latch 288 is triggered may be noted for the after stress test signal. If the fastest frequency at which the latch 288 is triggered has changed, the change may be deemed to have been caused by aging or other changes in the clock circuitry. The difference in noted frequencies for the first before stress reference signal and the second after stress test signal provides a proportional measure of the change in duty cycle as a result of circuit aging or other changes. It is appreciated that in some embodiments, changes in duty cycle may be measured in accordance with the description provided herein without the data path 154 being made resistant or immune to the effects of circuit aging. Thus, transistors including some or all of those from node 262 to node 276 need not be selectively disabled in such embodiments and made resistant to aging. Instead, some or all of the transistors may be connected directly to a supply voltage such as Vcc. It is further appreciated that the number of inverters and other circuit elements may vary in number including odd and even numbers of inverters, depending upon the particular application.

In the illustrated embodiment, the data path 154 includes a lower circuit portion 300 which is similar to the upper circuit portion 203 described above. Thus, the lower circuit portion 300 has an input section 302 similar to the input section 201 of the upper circuit portion 203. Utilizing both circuit portions 203, 300, the data path 154 may also be used to quantify clock skew aging degradation between edges of two different clocks or other signals running at the same frequency. When the Phase inputs 256, 304 of the circuit input sections 201, 302, respectively, are a logical 1, the data path 154 measures the clock skew degradation between the rising edges of two input signals at the Input1, Input2 inputs 162, 196, respectively. Conversely, when the Phase inputs 256, 304 of the circuit portions 203, 302, respectively, are a logical 0, the data path 154 measures the clock skew degradation between the falling edges of two input signals at the Input1, Input2 inputs 162, 196, respectively. It is appreciated that other logic values may be used to select rising or falling edges for measurement.

Figure 7:
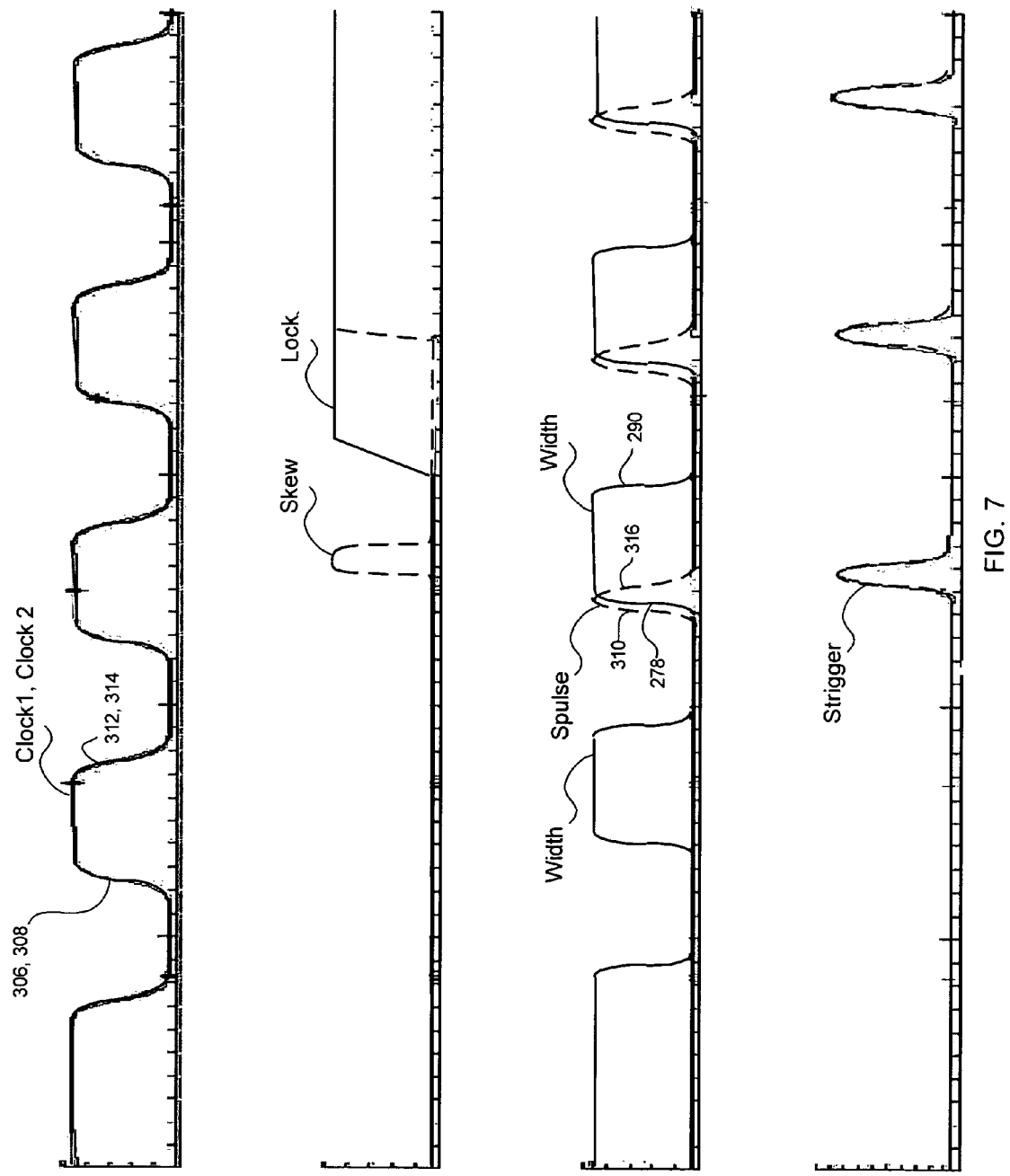
FIG. 7 is a timing diagram illustrating a clock skew measurement operation of one embodiment of the circuit of FIG. 4.

FIG. 7 shows an example of two signals, Clock1, Clock2, for which the clock skew degradation may be measured. In this example, the signals Clock1, Clock2, are phase aligned and running at the same frequency prior to aging of the circuit 152 (FIG. 3) which includes the clock generators for the Clock1, Clock2 signals. When the Phase input 256 of the circuit input section 201 is a logical 1, the rising edge 306 of the signal Clock1 starts the rising edge 278 of the Width signal discussed above in connection with FIG. 6. The rising edge 306 of the signal Clock1 starting the rising edge 278 of the Width signal is also depicted in FIG. 7. When the Phase input 304 of the circuit input section 302 is a logical 1, the rising edge 308 of the signal Clock2 starts the rising edge 310 of the Spulse signal which is generated in a manner similar to that of the Dpulse discussed above in connection with FIG. 6. It is appreciated that in some embodiments, the Phase inputs 256, 304 may be the same value or different values, depending upon the particular application.

Conversely, when the Phase input 256 of the circuit input section 201 is a logical 0, the falling edge 312 of the signal Clock1 starts the falling edge 290 of the Width signal discussed above in connection with FIG. 6. The falling edge 312 of the signal Clock1 starting the falling edge 290 of the Width signal is also depicted in FIG. 7. When the Phase input 304 of the circuit input section 302 is a logical 0, the falling edge 314 of the signal Clock2 starts the falling edge 316 of the Spulse signal as shown in FIG. 7.

Any timing skew changes between the two signals Clock1, Clock2 may be reflected in the timing between the Spulse signal and the Width signal. In a manner similar to the clock duty cycle measurement discussed above, this timing between the Spulse signal and the Width signal may be reflected in the fastest frequency to generate a latched signal at output 320 designated "Skew" of the lower circuit portion 300.

As previously mentioned, FIG. 7 depicts the signals Clock1, Clock2, phase aligned and running at the same frequency prior to aging of the circuit 152. When the clock frequency is relatively high, such as greater than 4 GHz, for example, there is, in this example, an overlap between the Width pulse and the Spulse to generate an Strigger pulse at input 322 of a rising edge triggered latch 324 which is similar to the latch 288. In the example of FIG. 7, at clock frequencies greater than 4 GHz, this overlap is sufficient to generate an Strigger pulse which is strong enough to trigger the latch 324. The latch output 320 designated Skew is locked with the "Lock" signal at a logical 1 such that the output Skew is a constant logical 1 value until the Lock signal becomes inactive or a logical 0 in this example.

As the frequency modulator 164 slows the frequency of the input signals Clock1, Clock2, there is eventually insufficient overlap between the Width signal and the Spulse signal to generate a constant logical 1 value at the Skew output. This frequency at which the constant logical 1 disappears may be noted as a before stress reference value for the input signals Clock1, Clock2.

After aging the clock circuits of the circuit 152 (with the data path 154 disabled), the input signals Clock1, Clock2 may be reintroduced to the data path 154 (with the data path 154 reenabled). Due to aging which can stress the clock circuits, the after stress input signal Clock1 may now lag behind the after stress input signal Clock2 by a particular time period such as 5 picoseconds, for example. As a consequence, in this after stress test, at 4 GHz, for example, there may be 5 picoseconds less overlap between the Width pulse and the Spulse than there was in the before stress test which generated the reference value. This reduced overlap may be insufficient to produce an Strigger pulse of sufficient strength to generate a constant "1" value at the Skew output. Accordingly, the frequency of the after stress input signals Clock1, Clock2 may need to be at a higher frequency, such as 4.0816 GHz, for example, to provide a larger overlap sufficient to generate a constant "1" at the Skew output. As the frequency modulator sweeps the frequency of the input signals Clock1, Clock2 from high to lower frequencies, the frequency at which the constant logical 1 disappears may be noted as an after stress test value for the input signals Clock1, Clock2. The cycle time difference, such as 5 picoseconds, for example, between the noted before stress reference frequency value and the noted after stress test frequency value may provide a proportional indication of the degree of clock skew change between the rising edges of the two signals Clock1, Clock2, as a result of circuit aging. The clock skew change between the falling edges of the two signals Clock1, Clock2, may be measured in a similar manner with the Phase signal set to a logical "0" value, for example.

Figure 8:
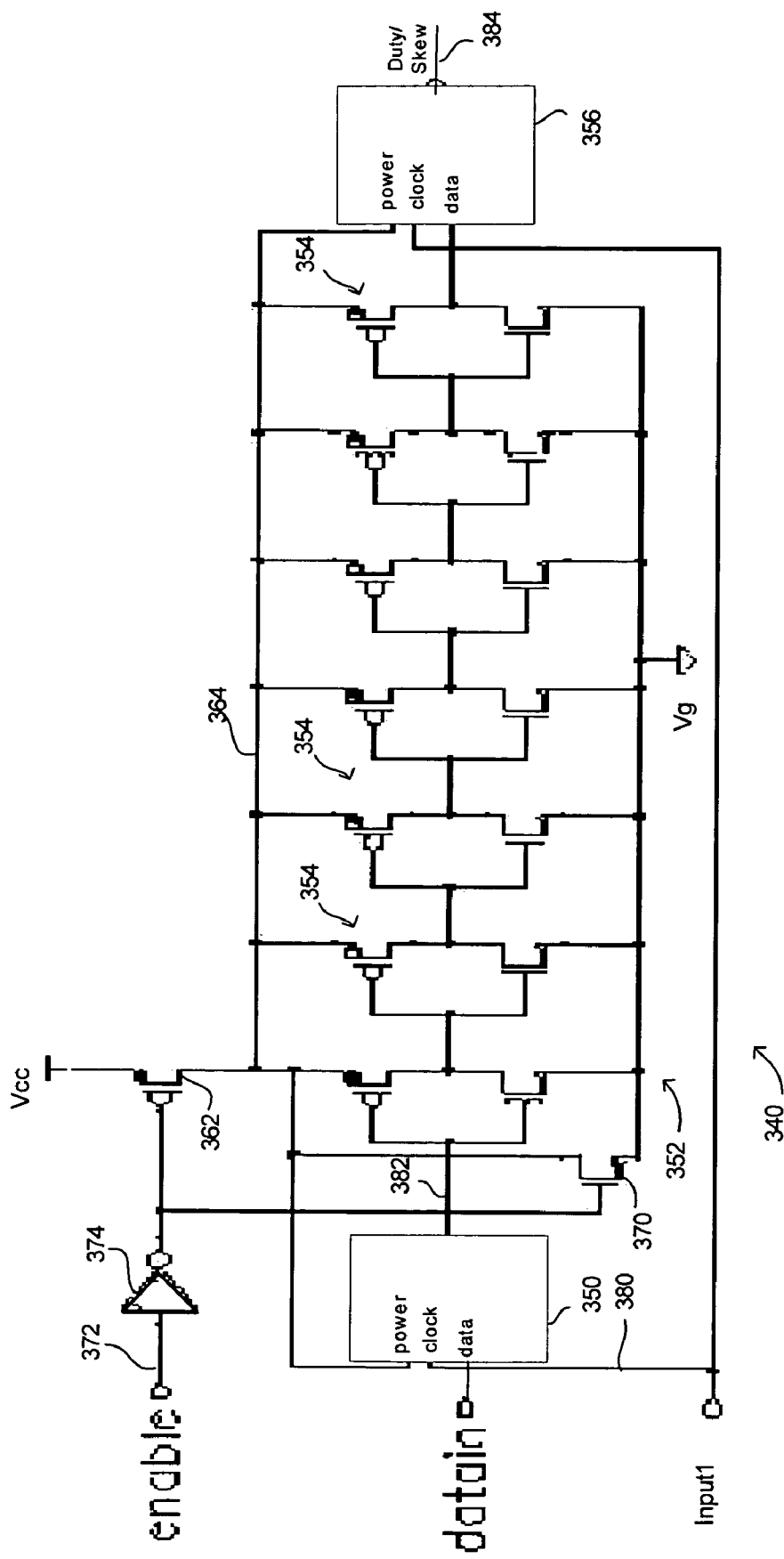
FIG. 8 is a schematic diagram of a data path portion of a signal degradation monitoring circuit in accordance with another embodiment of the description provided herein.

FIG. 8 illustrates an alternative embodiment of a data path 340 which includes a rising/falling edge transmit flip flop or latch 350, a delay line 352 comprising a plurality of inverters 354, and a falling/rising edge receive flip flop or latch 356. In this example also, transistors may be biased to provide little or no voltage differential between the gate and the drain or source to avoid transistor aging. The data path 340 includes a voltage or power source Vcc which is coupled by a transistor switch 362 to a common power bus 364 which selectively provides power to the transistors of the data path 340. The power bus 364 is also coupled by a transistor switch 370 to a ground or lower potential Vg. The conductive states of the transistor switches 362, 370 are controlled by an Enable signal provided on an input 372 which is coupled by an inverter 374 to the control inputs of the transistor switches 362, 370. The control input of the transistor switch 362 is inverted with respect to the control input of the transistor switch 370. Hence, when the Enable signal is active, the transistor switch 362 is conducting such that the common power bus 364 is at or near the potential of the power source Vcc, thereby providing power to the transistors of the data path 340 powered by the power bus 364. Conversely, when the Enable signal is inactive, the transistor switch 370 is conducting such that the common power bus 364 is at or near the Vg potential. In this embodiment, the inverter 374 and the power switch 362 are not biased against aging.

An Input1 signal such as a clock signal may be provided at the clock input 380 of the latch 350 to produce a pulse at an output 382. The propagation of the pulse through the data path 340 is delayed by the delay line 352. The receive latch 356 may be clocked by the same input signal Input1. If so, the output 384 depends upon the duty cycle of the clock signal Input1. If there is a sufficient overlap between the delayed pulse and the clock signal Input1, a logical 1 output may be latched. Hence, a duty cycle measurement may be undertaken before stress by modulating the frequency of the input signal Input1 in the manner discussed above to produce a fastest frequency for the before stress reference. Another duty cycle measurement may be undertaken after stress by modulating the frequency of the input signal Input1 in the manner discussed above to produce a fastest frequency for the after stress test. Any difference in the two fastest frequencies provides a proportional indication of a change in duty cycle caused by circuit aging.

The data path 340 may also be used to quantify clock skew aging degradation between two different clocks, by feeding the transmitting latch 350 with one clock and the receiving latch 356 with the other clock. Hence, the latches 350,356 may be run by different clocks. Upon modulating the frequency during the before stress reference test and during the after stress test, differences in the fastest frequencies may be noted to provide a proportional indication of changes in clock skew due to circuit aging.

In the illustraed embodiment, the data path 340 has seven inverters 364. It is appreciated that the number of inverters may vary in number including odd and even numbers of inverters, depending upon the particular application.

Additional Embodiment Details

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention. Further, although process operations, method operations, algorithms or the like may be described in a sequential order, such processes, methods and algorithms may be configured to work in alternate orders. In other words, any sequence or order of operations that may be described does not necessarily indicate a requirement that the operations be performed in that order. The operations of processes described herein may be performed in any order practical. Further, some operations may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article. The functionality and/or the features of a device may be alternatively embodied by one or more other devices which are not explicitly described as having such functionality/features. Thus, other embodiments of the present invention need not include the device itself.

The described operations may be implemented as a method, apparatus or article of manufacture using standard programming and/or engineering techniques to produce software, firmware, hardware, or any combination thereof. The term "article of manufacture" as used herein refers to code or logic implemented in a tangible medium, where such tangible medium may comprise hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by a processor. The tangible medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed. Of course, those skilled in the art will recognize that many modifications may be made to this configuration without departing from the scope of the present description, and that the article of manufacture may comprise any suitable information bearing medium.

The figures illustrate various logic circuitry using various logic elements including NAND gates, NOR gates etc. It is appreciated that the type of logic gates utilized will vary, depending upon the particular application.

In certain implementations, the embodiments may be included in a computer system including nonvolatile memory and a storage controller, such as a SCSI, Integrated Drive Electronics (IDE), Redundant Array of Independent Disk (RAID), etc., controller, that manages access to a non-volatile storage device, such as a magnetic disk drive, tape media, optical disk, etc. In alternative implementations, embodiments may be included in a system that does not include nonvolatile memory or a storage controller, such as certain hubs and switches.

In certain implementations, the embodiments may be implemented in a computer system including a video controller to render information to display on a monitor electrically coupled to the computer system including the host software driver and network controller, such as a computer system comprising a desktop, workstation, server, mainframe, laptop, handheld computer, telephone, etc. Alternatively, the features described herein may be implemented in a computing device that does not include a video controller, such as a switch, router, etc.

The devices 114 of the architecture of the system 102 may include a network controller to enable communication with a network, such as an Ethernet, a Fibre Channel Arbitrated Loop, etc. Further, the architecture may, in certain embodiments, include a video controller to render information on a display monitor, where the video controller may be implemented on a video card or integrated on integrated circuit components mounted on the motherboard.

An input device may be used to provide user input to the processor 104, and may include a keyboard, mouse, pen-stylus, microphone, touch sensitive display screen, or any other suitable activation or input mechanism. An output device may be capable of rendering information transmitted from the processor 104, or other component, such as a display monitor, printer, storage, etc.

The embodiments of the present description may be implemented on an expansion card such as a network card, such as a Peripheral Component Interconnect (PCI) card or some other card, or on integrated circuit components mounted on the motherboard.

The foregoing description of various embodiments has been presented for the purposes of illustration. It is not intended to be exhaustive or to limit to the precise form disclosed. Many modifications and variations are possible in light of the above teaching.

What is claimed is:

1. A method, comprising:
   enabling a data path of a monitor circuit of an integrated circuit;
   providing a reference signal to said enabled data path to produce a reference output of said monitor circuit;
   disabling said data path;
   operating said integrated circuit while said data path is disabled;
   reenabling said data path;
   providing a test signal to said reenabled data path to produce a test output of said monitor circuit; and
   comparing said test output to said reference output.

2. The method of claim 1 wherein said data path disabling includes biasing the source and drain of a plurality of transistors of said data path at the same potential.

3. The method of claim 1 wherein each of said test and reference signals is a clock signal.

4. The method of claim 3 further comprising modulating the frequency of each clock signal prior to passing each clock signal through the data path.

5. The method of claim 1 further comprising:
   generating in said data path a width pulse, the width of which is a function of the width of the duty cycle of a clock reference signal provided to said data path; generating a delay pulse which is delayed a period of time relative to said clock reference signal; and comparing said width pulse to said delay pulse to produce said reference output as a measure of the width of the duty cycle of the clock reference signal; and
   generating in said data path a width pulse, the width of which is a function of the width of the duty cycle of a clock test signal provided to said data path; generating a delay pulse in said data path which is delayed a period of time relative to said clock test signal; and comparing said width pulse to said delay pulse to produce said test output as a measure of the width of the duty cycle of the clock test signal; wherein said comparing said test output to said reference output includes comparing a measure of the width of the duty cycle of the clock reference signal to a measure of the width of the duty cycle of the clock test signal.

6. The method of claim 1 further comprising:
   generating in said data path a pulse, an edge of which is a function of a first clock reference signal provided to said data path; generating a delay pulse in said data path which is delayed a period of time relative to a second clock reference signal; and comparing said edge pulse to said delay pulse to produce said reference output as a measure of the skew between the first and second clock reference signals; and
   generating in said data path a pulse, an edge of which is a function of a first clock test signal provided to said data path; generating a delay pulse in said data path which is delayed a period of time relative to a second clock test signal; and comparing said edge pulse to said delay pulse to produce said test output as a measure of the skew between the first and second clock test signals wherein said comparing said test output to said reference output includes comparing a measure of the skew of the first and second clock references signals to a measure of the skew between the first and second clock test signals.

7. The method of claim 1 further comprising:
   generating a delay pulse in said data path which is delayed a period of time relative to a clock reference signal; and clocking a latch circuit using said clock reference signal to selectively latch said delay pulse to produce said reference output; and
   generating a delay pulse in said data path which is delayed a period of time relative to a clock test signal; and clocking a latch circuit using said clock test signal to selectively latch said delay pulse to produce said test output.

8. The method of claim 1 further comprising:
   generating in said data path a pulse, an edge of which is a function of a first reference signal provided to said data path; generating a delay pulse in said data path which is delayed a period of time relative to a second reference signal; and comparing said edge pulse to said delay pulse to produce said reference output as a measure of the skew between the first and second reference signals; and
   generating in said data path a pulse, an edge of which is a function of a first test signal provided to said data path; generating a delay pulse in said data path which is delayed a period of time relative to a second test signal; and comparing said edge pulse to said delay pulse to produce said test output as a measure of the skew between the first and second test signals wherein said comparing said test output to said reference output includes comparing a measure of the skew of the first and second references signals to a measure of the skew between the first and second test signals.

9. An integrated circuit, comprising:
a monitor circuit having a data path adapted to be selectively enabled and disabled, and control logic adapted to:
enable said data path;
provide a reference signal to said enabled data path to produce a reference output of said monitor circuit;
disable said data path;
subsequent to said disabling, reenable said data path;
provide a test signal to said reenabled data path to produce a test output of said monitor circuit; and
compare said test output to said reference output.

10. The integrated circuit of claim 9 wherein said data path includes a plurality of transistors, each having a source and drain, and said data path further includes biasing circuitry, responsive to the state of a signal provided by said control logic, to bias the source and drain of each of said plurality of transistors of said data path at the same potential.

11. The integrated circuit of claim 10 wherein each transistor has body connections, and said data path biasing circuitry, is further responsive to the state of a signal provided by said control logic, to bias the body connections of each of said plurality of transistors of said data path at the same potential as the source of each transistor.

12. The integrated circuit of claim 9 wherein each of said test and reference signals is a clock signal.

13. The integrated circuit of claim 12 wherein said monitor circuit further includes logic adapted to modulate the frequency of each clock signal prior to passing each clock signal through the data path.

14. The integrated circuit of claim 9 wherein said data path has circuitry adapted to, in response to a clock reference signal provided to said data path:
generate in said data path a width pulse, the width of which is a function of the width of the duty cycle of the clock reference signal provided to said data path; generate a delay pulse which is delayed a period of time relative to said clock reference signal; and compare said width pulse to said delay pulse to produce said reference output as a measure of the width of the duty cycle of the clock reference signal; and
wherein said data path circuitry is further adapted to, in response to a clock test signal provided to said data path:
generate in said data path a width pulse, the width of which is a function of the width of the duty cycle of said clock test signal provided to said data path; generate a delay pulse in said data path which is delayed a period of time relative to said clock test signal; and compare said width pulse to said delay pulse to produce said test output as a measure of the width of the duty cycle of the clock test signal; wherein said control logic comparing said test output to said reference output includes comparing a measure of the width of the duty cycle of the clock reference signal to a measure of the width of the duty cycle of the clock test signal.

15. The integrated circuit of claim 9 wherein said data path has circuitry adapted to, in response to first and second clock reference signals provided to said data path:
generate in said data path a pulse, an edge of which is a function of said first clock reference signal provided to said data path; generate a delay pulse in said data path which is delayed a period of time relative to said second clock reference signal; and compare said edge pulse to said delay pulse to produce said reference output as a measure of the skew between the first and second clock reference signals; and
wherein said data path circuitry is further adapted to, in response to first and second clock test signals provided to said data path:
generate in said data path a pulse, an edge of which is a function of said first clock test signal provided to said data path; generate a delay pulse in said data path which is delayed a period of time relative to said second clock test signal; and compare said edge pulse to said delay pulse to produce said test output as a measure of the skew between the first and second clock test signals wherein said control logic comparing said test output to said reference output includes comparing a measure of the skew of the first and second clock references signals to a measure of the skew between the first and second clock test signals.

16. The integrated circuit of claim 15 wherein said edge of said pulse is a function of either a leading edge or a trailing edge of a signal as selected by a first selection signal and wherein said delay pulse is delayed relative to either a leading edge or trailing edge of a signal as selected by a second selection signal.

17. The integrated circuit of claim 16 said first and second selection signals are different from each other.

18. The integrated circuit of claim 9 wherein said data path has a latch circuit and has circuitry adapted to, in response to a clock reference signal provided to said data path:
generate a delay pulse in said data path which is delayed a period of time relative to said clock reference signal; and clock said latch circuit using said clock reference signal to selectively latch said delay pulse to produce said reference output; and
wherein said data path circuitry is further adapted to, in response to a clock test signal provided to said data path:
generate a delay pulse in said data path which is delayed a period of time relative to said clock test signal; and clock said latch circuit using said clock test signal to selectively latch said delay pulse to produce said test output.

19. The integrated circuit of claim 9 wherein said data path has a receive latch circuit and has circuitry including a transmit latch circuit, adapted to, in response to a first reference signal provided to said data path:
generate a delay pulse in said data path which is delayed a period of time relative to said first reference signal; and clock said receive latch circuit using a second reference signal to selectively latch said delay pulse to produce said reference output; and
wherein said data path circuitry is further adapted to, in response to a first test signal provided to said data path:
generate a delay pulse in said data path which is delayed a period of time relative to said first test signal; and clock said receive latch circuit using a second test signal to selectively latch said delay pulse to produce said test output.

20. The integrated circuit of claim 9 wherein said data path has circuitry adapted to, in response to first and second reference signals provided to said data path:
generate in said data path a pulse, an edge of which is a function of said first reference signal provided to said data path; generate a delay pulse in said data path which is delayed a period of time relative to said second reference signal; and compare said edge pulse to said delay pulse to produce said reference output as a measure of the skew between the first and second reference signals; and wherein said data path circuitry is further adapted to, in response to first and second test signals provided to said data path:

generating in said data path a pulse, an edge of which is a function of said first test signal provided to said data path; generate a delay pulse in said data path which is delayed a period of time relative to said second test signal; and compare said edge pulse to said delay pulse to produce said test output as a measure of the skew between the first and second test signals wherein said control logic comparing said test output to said reference output includes comparing a measure of the skew of the first and second references signals to a measure of the skew between the first and second test signals.

21. An integrated circuit, comprising:

a monitor circuit having a data path and control logic adapted to:

provide a clock reference signal to said data path to produce a reference output of said monitor circuit wherein said data path has circuitry adapted to, in response to said clock reference signal provided to said data path:

generate in said data path a width pulse, the width of which is a function of the width of the duty cycle of the clock reference signal provided to said data path; generate a delay pulse which is delayed a period of time relative to said clock reference signal; and compare said width pulse to said delay pulse to produce said reference output as a measure of the width of the duty cycle of the clock reference signal;

provide a clock test signal to said data path to produce a test output of said monitor circuit wherein said data path circuitry is further adapted to, in response to said clock test signal provided to said data path:

generate in said data path a width pulse, the width of which is a function of the width of the duty cycle of said clock test signal provided to said data path; generate a delay pulse in said data path which is delayed a period of time relative to said clock test signal; and compare said width pulse to said delay pulse to produce said test output as a measure of the width of the duty cycle of the clock test signal; and compare said test output to said reference output wherein said control logic comparing said test output to said reference output includes comparing a measure of the width of the duty cycle of the clock reference signal to a measure of the width of the duty cycle of the clock test signal.

22. The integrated circuit of claim 21 wherein said monitor circuit further includes logic adapted to modulate the frequency of each clock signal prior to passing each clock signal through the data path.

* * * * *